Figure 1:
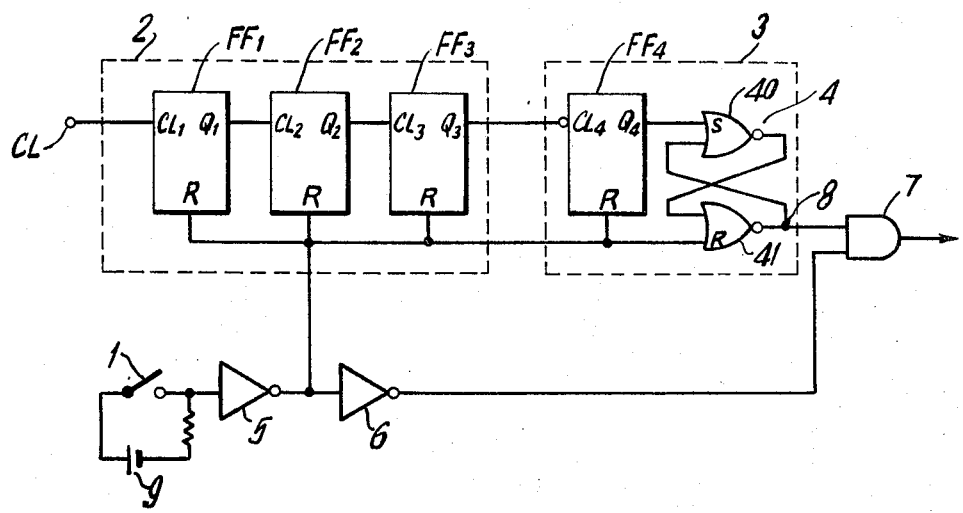

United States Patent [19]
Kodama

[11] 3,989,960
[45] Nov. 2, 1976

[54] CHATTERING PREVENTIVE CIRCUIT
[75] Inventor: Yukuo Kodama, Tokyo, Japan
[73] Assignee: Nippon Electric Company, Ltd., Tokyo, Japan
[22] Filed: June 23, 1975
[21] Appl. No.: 589,081

[30] Foreign Application Priority Data
June 29, 1974 Japan.............................. 49-74693

[52] U.S. Cl.............................. 307/247 A; 328/164
[51] Int. Cl.²....................................... H03K 17/16
[58] Field of Search................ 307/247 A; 328/162, 328/163, 164

[56] References Cited
UNITED STATES PATENTS
| | | | |
|---|---|---|---|
| 3,226,568 | 12/1965 | Samwel............................ | 307/247 A |
| 3,624,518 | 11/1971 | Dildy............................... | 307/247 A |
| 3,725,680 | 4/1973 | Silva................................ | 307/247 A |
| 3,790,821 | 2/1974 | Adamson......................... | 307/247 A |
| 3,824,583 | 7/1974 | Turtle.............................. | 307/247 A |

*Primary Examiner*—John S. Heyman
*Attorney, Agent, or Firm*—Hopgood, Calimafde, Kalil, Blaustein & Lieberman

[57] ABSTRACT

A chattering prevention circuit includes a counter, which upon receiving an input signal including a chattering signal such as from a switch contact, begins to count a clock signal. When the count reaches a predetermined value, a gate signal is generated which, in turn, is employed to gate the input signal. The input signal is delayed by a time corresponding to the period during which the chattering phenomenon remains in effect following the closing of the contact, thereby to prevent chattering.

5 Claims, 5 Drawing Figures

CHATTERING PREVENTIVE CIRCUIT

The present invention relates to circuits for preventing chattering from occurring across contacts of relays, switches and the like, and more particularly to circuits for preventing chattering, which occurs during on-off actions across unipolar switch contacts, from affecting an associated circuit.

In a unipolar switch, chattering takes place during on-off actions, and chattering effects upon the associated circuits remain usually for 50 to 100 ms after contact closing, depending on the kind of mechanical contact used and the state being controlled. To prevent chattering, prior art techniques have provided delay circuits to delay the effect of contact closing for 50 to 100 ms after the switch contacts are closed. This prior chattering prevention circuit consists essentially of an integrator and a multivibrator or the like which employ capacitors and is thus unsuited for fabrication into an integrated circuit.

Recently an increasing number of electronic timepieces constituted of a semiconductor integrated circuit have been manufactured. In such devices, a unipolar switch, more particularly a single-pole single-throw switch is commonly used for time correction, to ensure proper operation of these timepieces, chattering in this unipolar switch must be eliminated. Prior art techniques, however, have failed to realize efficient chattering prevention circuits suited for fabrication into an integrated circuit without using capacitors.

It is, therefore, an object of the invention to provide a chattering prevention circuit which is suited for fabrication into an integrated circuit.

It is a further object of the invention to provide a chattering prevention circuit which does not utilize capacitors.

It is another object of the invention to provide a chattering prevention circuit suited for use in electronic timepieces for time correction purposes.

With these and other objects in view, the invention provides a chattering prevention circuit having a delay circuit including a counter circuit constituted of flip-flop circuits. The counter circuit, upon receiving an input signal including a chattering signal such as from a switch contact, begins to count a clock signal of a given frequency. When the count reaches a given number, a following circuit generates a gate signal and gate circuit of a succeeding stage gates the switch contact signal by receiving the gate signal. Accordingly, the switch contact signal goes to the circuit of the following stage after the counter circuit counts a given number. The input contact signal is thus delayed by a given time following contact closing, so that chattering is prevented by determining the delay to be equal or nealy equal to the period during which the chattering phenomena remains in effect.

Figure 2:
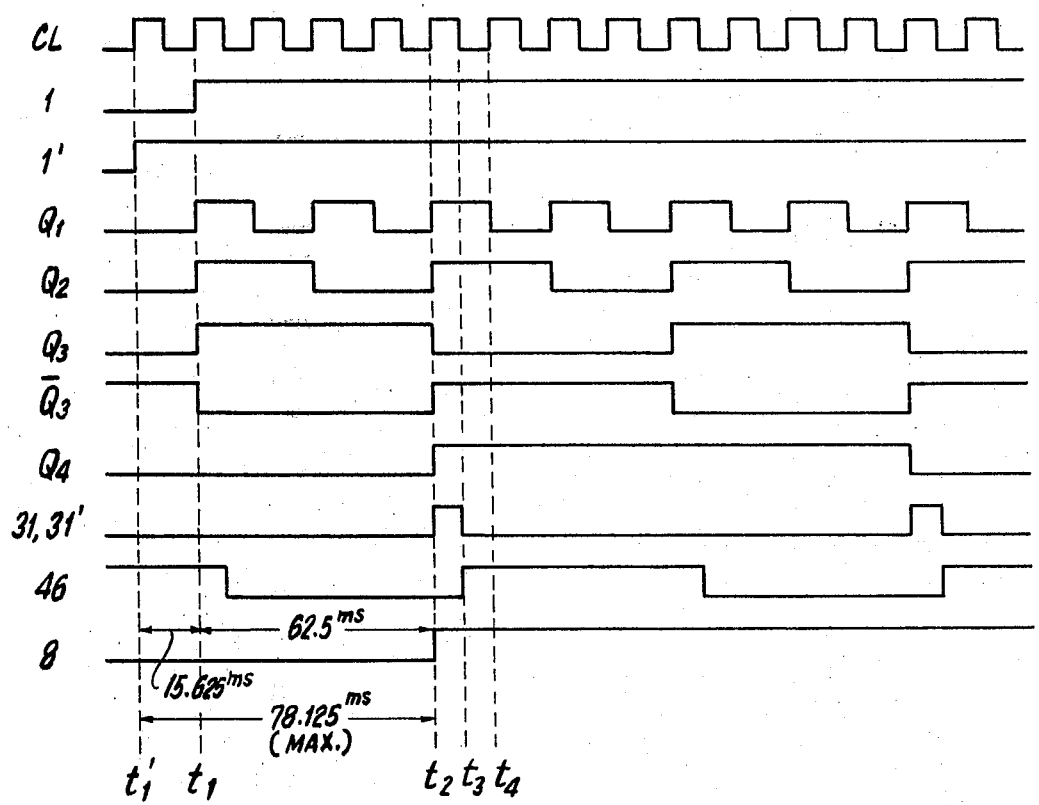
Figure 3:
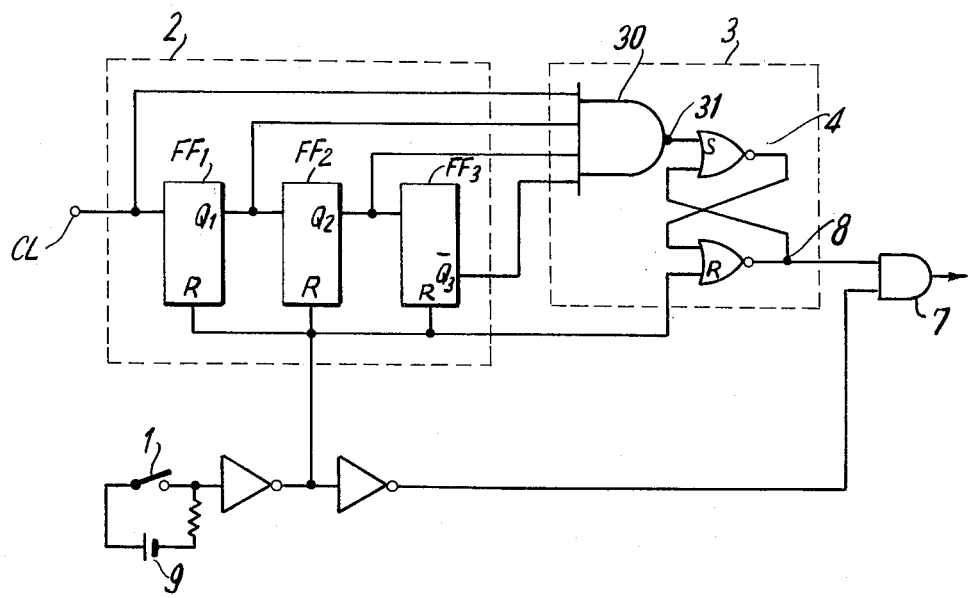
Figure 4:
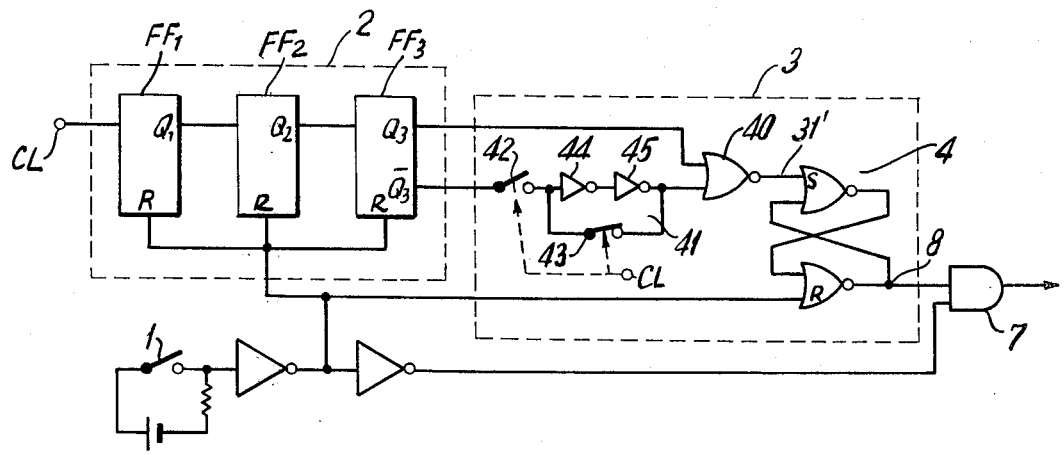
Figure 5:
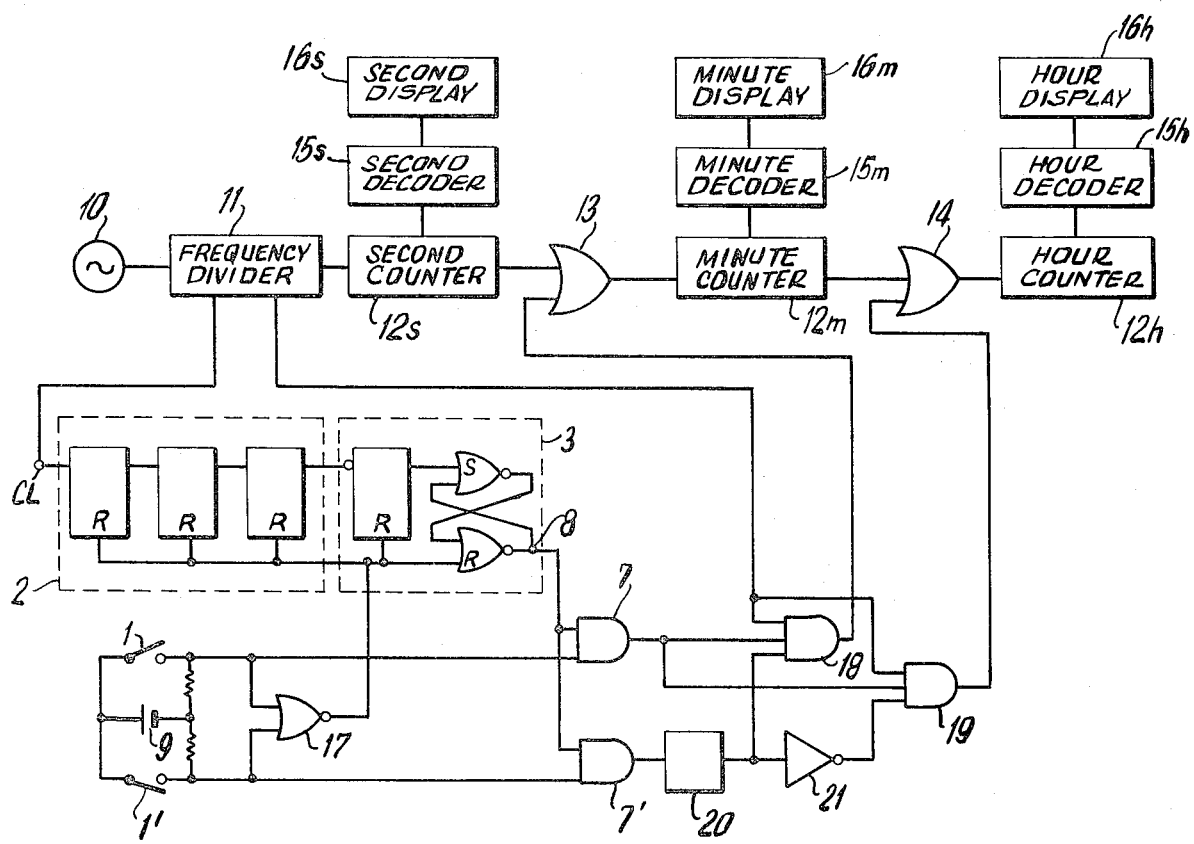

Other objects, features and advantages of the invention will become more apparent from the following description when read in conjunction with the accompanying drawing, wherein:

FIG. 1 is a block diagram of a chattering prevention circuit according to an embodiment of the invention, FIG. 2 is a diagram showing waveforms appearing in the circuit shown in FIG. 1, FIGS. 3 and 4 are block diagrams of chattering prevention circuits according to alternative embodiments of the invention, and FIG. 5 is a block diagram showing an electronic timepiece employing the chattering prevention circuit of the invention.

The circuit illustrated in FIG. 1, includes a unipolar switch 1 which exhibits chattering phenomena. A clock signal CL of a suitable frequency is supplied to a counter circuit 2 constituted of a cascade of three flip-flops $FF_1$ to $FF_3$. These flip-flops are operated by the front edge of an input pulse. An input signal of the counter circuit 2 is applied to an input of a gate signal generating circuit 3, which comprises a flip-flop $FF_4$ and a set-reset flip-flop 4 (or briefly, RS flip-flop). The flip-flop $FF_4$ is operated by the trailing edge of an input signal. The clock signal CL is supplied to the first stage flip-flop $FF_1$, and an output $Q_4$ of the flip-flop $FF_4$ is applied to the set input of the RS flip-flop 4. This RS flip-flop comprises, for example, two-input NOR circuits 40 and 41. The NOR circuit 40 has one input connected to the output of the NOR circuit 41, and the NOR circuit 41 has one input connected to the output of the NOR circuit 40. The other input of the NOR circuit 40 serves as the set input S of the RS flip-flop 4, and the other input of the NOR circuit 41 serves as the reset input R thereof. The output of the switch 1 goes through an inverter 5 to the reset terminals R of the flip-flops $FF_1$ to $FF_4$ and RS flip-flop 4, and through an inverter 6 to one input of a two-input AND gate circuit 7. which, in turn, has its other input connected to the reset output of the RS flip-flop 4, i.e., the output 8 of the NOR circuit 41.

When the switch 1 is in the off state, a high level voltage inverted from a low level voltage of a power source 9 by the inverter 5 is supplied to the reset terminals R of the counter circuit 2 and the gate signal generating circuit 3. As a result, the counter circuit 2 does not perform counting, the gate signal generating circuit 3 is in the reset state, a low level output is supplied to the AND gate circuit 7, and the AND gate circuit 7 closes its gate. If, for example the input signal CL to the counter circuit 2 is of a 50% duty pulse of 64 Hz, as indicated by CL in FIG. 2, and the switch 1 turns on at $t_1$, as indicated by a waveform 1 in FIG. 2, the output of the switch 1 stands at a high level, and the output of the inverter 5 is at a low level, causing the counter circuit 2 to start counting the clock pulse CL. The input signal frequency is halved in succession as it passes through the flip-flops $FF_1$ to $FF_3$, resulting in waveforms $Q_1$, $Q_2$ and $Q_3$ as shown in FIG. 2. Because the flip-flop $FF_4$ is operated by the trailing edge of an input, its output $Q_4$ rises at $t_2$ at which time the output $Q_3$ of the flip-flop $FF_3$ falls. The RS flip-flop 4 is set for the first time by the output $Q_4$. Commencing at $t_2$, the output 8 of the RS flip-flop 4 stands for the first time at a high level, causing the AND gate circuit 7 to be opened. Thus, from $t_2$, a high level signal from the switch 1 through the inverter 6 is supplied to the circuit of the following stage by way of the AND gate circuit 7, thereby causing a following stage to start operating. In other words, the following stage is operated in a period ($t_2 - t_1$) after the switch 1 turns on. This delay ($t_2 - t_1$) varies according to when the switch 1 turns on relative to the input CL of the counter circuit 2. The delay ($t_2 - t_1$) is shortest when the switch 1 turns on immediately before the rise of the input CL, as indicated by the waveform 1 in FIG. 2, and longest when the switch 1 turns on immediately after the rise of the input CL, as indicated by a waveform 1'. In practice, the delay is between four times the period of input CL (i.e., 15.625 ms × 4 = 62.5 ms) and five times that period (i.e., 15.625 ms × 5 = 78.125 ms), with a maximum error of 15.625 ms. The AND gate circuit 7 is opened between 62.5 and 78.125 ms after the switch 1 is operated, and this delay is the period for which chattering phenomena remain affecting the succeeding circuits. Then, when the switch 1 is turned off, the RS flip-flop 4 is reset and the AND gate circuit 7 is closed, to enable the following stage circuit to be operated free from chattering phenomena.

Referring to the embodiment of the present invention shown in FIG. 3, a four-input AND gate circuit 30 is used in place of the flip-flop $FF_4$ of the circuit in FIG. 1. The clock signal CL and outputs $Q_1$, $Q_2$ of flip-flops $FF_1$, $FF_2$ are respectively applied to first, second and third inputs of the AND gate circuit 30, and a fourth input thereof is supplied with an output $\overline{Q}_3$ of the flip-flop $FF_3$ which is opposite in polarity to the other output $Q_3$ of $FF_3$. An output 31 of the AND gate circuit 30 is connected to the set-input S of the RS flip-flop 4.

In this arrangement, when the switch 1 turns on at $t_1$ as indicated in FIG. 2, the counter circuit 2 starts to count the clock pulses CL, as described above. Therefore, the output signals of flip-flops $FF_1$, $FF_2$ and $FF_3$ have waveforms $Q_1$, $Q_2$ and $\overline{Q}_3$, as shown in FIG. 2, respectively. Thus, signals $Q_1$, $Q_2$ and $\overline{Q}_3$ are all in a high level at the same time $t_2$ and the output 31 of the AND gate circuit 30 rises to a high level. The clock pulse CL falls to a low level at $t_3$ and, as a result, the output 31 of the AND gate circuit 30 turns to a low level. Therefore, a pulse 31 is generated by the AND gate circuit 30 such as shown in FIG. 2. The RS flip-flop 4 is set by the pulse 31 and the output 8 thereof rises for the first time to a high level at $t_2$, causing the AND gate circuit 7 to be opened. Thus, beginning at $t_2$, a high level signal from the switch 1 through the AND gate circuit 7 is supplied to the circuit of the succeeding stage.

FIG. 4 illustrates another embodiment of the present invention, in which, a two-input NOR gate circuit 40 and a latch circuit 41 are used in place of the flip-flop $FF_4$ of the circuit in FIG. 1. The latch circuit 41 consists of two switching elements 42, 43 and two inverters 44, 45. An input of the switching element 42 is connected to the output $\overline{Q}_3$ of the flip-flop $FF_3$, and an output of the switching element 42 is connected to an input of the inverter 44 and to an output of the switching element 43. An output of the inverter 44 is connected to an input of the inverter 45. An output of the inverter 44 is connected to an input of the switching element 43 and to one input of the NOR gate circuit 40. The other input of the NOR gate circuit 40 is supplied with the output $Q_3$ of the flip-flop $FF_3$. An output 31' of the NOR gate circuit 40 is applied to the set input S of the RS flip-flop 4.

The switching elements 42, 43 are alternately turned on and off. For that purpose, the switching element 42 is turned on and off by the low and high levels of the clock pulses CL, respectively, while the switching element 43 is turned on and off by high and low levels of the clock pulses CL, respectively. Therefore, for example, the switching elements 42, 43 can be realized by P-channel and N-channel insulated-gate field effect transistors, respectively. When the switch 1 is turned on at $t_1$, the counter circuit 2 starts to count the clock pulses CL. Therefore, the outputs of $Q_3$ and $\overline{Q}_3$ are at low and high levels at $t_2$, respectively, as shown in FIG. 2. Because the clock pulse CL is in a high level during a period from $t_2$ to $t_3$, the switching element 42 is in the off-state and the switching element 43 is in the on-state. Therefore, during the period from $t_2$ to $t_3$ the output 46 of the inverter 45 remains at a low level which is the level of the output $\overline{Q}_3$ of the flip-flop $FF_3$ prior to $t_2$, by a closed loop consisting of the inverters 44, 45 and the switching element 43. During the period from $t_3$ to $t_4$, the clock pulse CL is in a high level and hence switching elements 42, 43 are respectively in an on-state and an off-state. Therefore, the output 46 of the inverter 45 rises to a high level as shown in FIG. 2. The signals $Q_3$ and 46 are applied to the inputs of the NOR gate circuit 40 and hence a pulse 31', shown in FIG. 2, is generated by the NOR gate circuit 40 during the period from $t_2$ to $t_3$. Pulse 31' sets the RS flip-flop 4 for the first time.

Thus, the AND gate circuit 7 is opened at $t_2$ and a high level signal from the switch 1 is supplied to the following circuit.

The chattering prevention circuit of the invention is well suited for use in the time correction circuit of an electronic timepiece because it makes a delay of 62.5 to 78.125 ms available, which is shorter than a maximum delay of 100 ms allowed for a timepiece to maintain accuracy. The chattering prevention circuit is simple in construction and uses no capacitors and hence can easily be incorporated into a semiconductor integrated circuit in a minimum amount of space.

FIG. 5 illustrates in block diagram form the chattering prevention circuit of the invention, as it is shown in FIG. 1, as applied to a time correction switch in an electronic timepiece. An output of a stable oscillator 10, such as a quartz oscillator, is frequency-divided by a frequency divider 11 to provide a signal with a period of one second, i.e., a signal of 1 Hz. This signal is counted by a second counter circuit 12s of which the full count is 60. The output of the counter 12s is supplied through an OR gate circuit 13 to a minute counter 12m of which the full count is 60. The carry output of the counter 12m is supplied through an OR gate circuit 14 to an hour counter 12h of which the full count is 12 or 24. The counted values of the individual counters 12s, 12m and 12h are decoded by decoders 15s, 15m and 15h respectively and are displayed on digital displays 16s, 16m and 16h, respectively in second, minute and hour units.

Unipolar switches 1 and 1' are used to correct the displayed time values, and a chattering preventive circuit of the invention comprising a counter circuit 2 and a gate signal generating circuit 3 is used to prevent chattering from occurring in the switches 1 and 1'. A clock signal of a frequency such as 64 Hz, which is derived from the frequency divider 11, is applied to the CL input of the counter circuit 2. The gate signal generating circuit 3 has its output 8 connected to the inputs of two-input AND gate circuits 7 and 7'.

The time correction switches 1 and 1' are normally opened, causing a power source 9 to supply a low level voltage to the other inputs of the AND gate circuits 7 and 7', as well as to the two inputs of a two-input NOR gate circuit 17. A normally high level output of the NOR gate circuit 17 is supplied to the reset input R of the counter circuit 2 and the gate signal generating circuit 3, thereby resetting the chattering prevention circuit.

The output of the AND gate circuit 7 is applied to the inputs of three-input AND gate circuits 18 and 19. A quick advancing signal for time correction is derived from the frequency divider 11 and is supplied to the AND gate circuits 18 and 19. The output of the AND gate circuit 7' is supplied to a flip-flop 20, and the output of the flip-flop is connected to one input of the AND gate circuit 18 and through an inverter 20 to one input of the AND gate circuit 19. The output of the AND gate circuit 18 is connected to the outer input of the OR gate circuit 13, and the output of the AND gate circuit 19 is connected to the other input of the OR gate circuit 14.

As described, the AND gate circuits 7 and 7' are normally closed, causing the AND gate circuits 18 and 19 to be closed. As a result, the counter circuit 12 performs normal time counting. When the switch 1 is closed to correct the minute time display 16m, one input of the NOR gate circuit 17 stands at a high level from the power source 9, thereby causing the output of the NOR gate circuit 17 to stand at a low level. Therefore, the counter circuit 2 and the gate signal generating circuit 3 are set, the chattering preventive circuit counts the signal CL of 64 Hz, and the AND gate circuits 7 and 7'' are opened at a maximum of 78.125 ms after the switch 1 is turned on. The output of the AND gate circuit 7 sets up a high level where no chattering phenomena due to the switch 1 are present, to cause the AND gate circuit 18 to be opened. In this operation, the other input of the AND gate circuit 7' remains at a low level since the switch 1' is in the off state, and hence the output of the AND gate circuit 7' remains unchanged. When the output of the flip-flop 20 stands at a high level, the output of the inverter 21 is at a low level, and the AND gate circuit 19 remains closed or in the steady state. Because the outputs of the flip-flop 20 and AND gate circuit 7 are both at a high level, the quick advancing signal derived from the frequency divider 11 is supplied to the minute counter 12m through the AND gate circuit 18 and the OR gate circuit 13, whereby the minute display advances to a correct value.

Time display 16h may be corrected in the following manner. The switch 1' is closed instantaneously. By this, the output of the flip-flop 20 turns from a high level to a low level at a maximum of 78.125 ms after contact closing, i.e., after chattering phenomena occur due to the switch 1'. As a result, the AND gate circuit 18 is closed and the AND gate circuit 19 is opened. In this state, when the switch 1 is closed, the output of the AND gate circuit 6 turns into a high level after prevention of chattering of switch 1, and this high level signal is applied to the AND gate circuit 19 which is in the off state. Accordingly, the quick advancing signal is applied to the hour counter 12h through the AND gate circuit 19 and the OR gate circuit 14, whereby the hour counter 12h counts the signal at a speed higher than normal, thus correcting the time being displayed on the hour display 16h.

Thus, by using the chattering prevention circuit of the invention in an electronic timepiece, a deviation of time correction due to chattering can be eliminated and time can be corrected with high accuracy. According to the invention, the chattering prevention circuit can easily be incorporated into the semiconductor integrated circuit of an electronic timepiece because, as described, the clock signal to the delay circuit necessary to control the chattering prevention circuit can be obtained from the frequency divider circuit.

In the embodiments of the invention herein specifically described, a pulse signal of 64 Hz is used as the clock signal CL to the counter circuit 2, which comprises three stages of flip-flops. Instead, other suitable arrangements may be employed according to circuits or devices used with the chattering prevention circuit. For example, for a clock signal CL of 32 Hz used in an electronic timepiece, a counter circuit of the chattering prevention circuit can be constituted of one stage of flip-flop. Then, as in FIG. 2, the minimum delay $(t_2 - t_1)$ is 46.875 ms, and the maximum delay is 93.75 ms with the switch turn-on error $(t_1 - t_1')$, 46.875 ms, taken into consideration. In other words, the maximum delay is 93.75 ms at a 32 Hz clock pulse, which is still within a maximum delay of 100 ms allowed for time correction on an electronic timepiece.

At a clock pulse of 128 Hz, a minimum delay $(t_2 - t_1)$ of 62.5 ms and a maximum delay of 78.3125 ms are obtained by the use of 7 stages of flip-flops.

As will be evident, in a chattering prevention circuit for time correction of an electronic timepiece, the higher the frequency of the clock signal, the higher will become the accuracy of time correction. This, however, necessitates a larger number of counter stages in the counter circuit.

The frequency of the clock signal can be determined to meet the chattering time which varies according to the kind of the switch used.

While preferred embodiments of the invention and specific modifications thereof have been described, it is to be understood that numerous variations may occur to those skilled in the art without departing from the spirit of the invention.

What is claimed is:

1. A chattering prevention circuit comprising a circuit for generating a switching signal including a chattering signal, a source of clock pulses, a counter circuit connected to said source of clock pulses and coupled with said switching signal generating circuit, said counter circuit starting to count said clock pulses in response to said switching signal and continuing to count said clock pulses at least for a period of time during which said chattering signal is included in said switching signal, means connected to said counter circuit for generating a gate signal after said period of time, a gate circuit connected to the output of said gate signal generating means, an output terminal connected to said gate circuit, said gate circuit passing said switching signal during the presence of said gate signal to said output terminal, whereby the switching signal from which said chattering signal is removed is obtained at said output terminal.

2. A chattering prevention circuit as claimed in claim 1, wherein said switching signal generating circuit includes means for generating a command signal commanding said counter circuit to start to count said clock pulses in response to the generation of said switching signal, and said counter circuit includes at least one flip-flop having a first output and a second output opposite in polarity to said first output.

3. A chattering prevention circuit as claimed in claim 2, wherein said gate signal generating means comprises another flip-flop operated by the trailing edge of said first output of said flip-flop of said counter circuit, and a set-reset flip-flop having set and reset terminals, said set terminal being connected to the output of said another flip-flop, said reset terminal being supplied with said command signal, and the output of said set-reset flip-flop being connected to the input of said gate circuit.

4. A chattering prevention circuit as claimed in claim 2, wherein said gate signal generating means comprises a second gate circuit having at least two input terminals, one input terminal of said second gate circuit being supplied with said clock pulses, the other input terminal of said second gate circuit being connected to said second output of said flip-flop of said counter circuit, and a set-reset flip-flop having set and reset terminals, said set terminal being connected to the output of said second gate circuit, said reset terminal being supplied with said command signal, and the output of said set-reset flip-flop being connected to the input of said first-mentioned gate circuit.

5. A chattering prevention circuit as claimed in claim 2, wherein said gate signal generating means comprises first and second switching elements each having input and output terminals, first and second inverters each having input and output terminals, said input terminal of said first switching element being connected to said second output of said flip-flop of said counter circuit, said output terminal of said first switching element being connected to said output terminal of said second switching element and said input terminal of said first inverter, said output terminal of said first inverter being connected to said input terminal of said second inverter, said output terminal of said second inverter being connected to said input terminal of said second switching element, a NOR gate having first and second input terminals, said first input terminal of said NOR gate being connected to said first output of said flip-flop of said counter circuit, said second input terminal of said NOR gate being connected to said output terminal of said second inverter, and a set-reset flip-flop having set and reset terminals, said set terminal being connected to the output of said NOR gate, said reset terminal being supplied with said command signal, the output of said set-reset flip-flop being connected to the input of said first gate circuit, and said first and second switching elements being alternately turned on and off by said clock pulses.

* * * * *